(12) United States Patent
Kim et al.

(10) Patent No.: US 9,373,668 B2
(45) Date of Patent: Jun. 21, 2016

(54) ORGANIC LIGHT EMITTING DIODE DISPLAY DEVICE AND METHOD OF FABRICATING THE SAME

(71) Applicant: LG Display Co., Ltd, Seoul (KR)

(72) Inventors: Eun-Ah Kim, Asan-si (KR); Joon-Suk Lee, Seoul (KR); Jae-Sung Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 21 days.

(21) Appl. No.: 14/461,012

(22) Filed: Aug. 15, 2014

(65) Prior Publication Data

US 2015/0179718 A1 Jun. 25, 2015

(30) Foreign Application Priority Data

Dec. 20, 2013 (KR) .................. 10-2013-0160486

(51) Int. Cl.
*H01L 27/32* (2006.01)
*H01L 51/52* (2006.01)

(52) U.S. Cl.
CPC ........ *H01L 27/3246* (2013.01); *H01L 51/5212* (2013.01); *H01L 51/5228* (2013.01)

(58) Field of Classification Search
CPC . H01L 27/28; H01L 27/3246; H01L 51/5228; H01L 51/5212
See application file for complete search history.

(56) References Cited

U.S. PATENT DOCUMENTS

| 7,652,422 | B2* | 1/2010 | Bae | ............. | H01L 27/3246 257/59 |
| 2012/0208303 | A1* | 8/2012 | Yamazaki | ............. | H01L 51/56 438/23 |

* cited by examiner

*Primary Examiner* — Laura Menz
*Assistant Examiner* — Candice Y Chan
(74) *Attorney, Agent, or Firm* — Birch, Stewart, Kolasch & Birch, LLP

(57) ABSTRACT

An organic light emitting diode display device and a method of fabricating the organic light emitting diode display device are discussed. The organic light emitting diode display device includes a plurality of first electrodes extending in a first direction and a second direction; a common line to adjacent plurality of first electrodes; a pixel definition layer disposed at boundaries of the plurality of first electrodes; an adhesive pattern disposed on the common line; a wall on the adhesive pattern and overlapping the common line; an organic layer on the plurality of first electrodes and on the wall; and a second electrode on the organic layer and contacting the common line in a portion under an overhang of the wall, wherein the organic layer is spaced apart from the adhesive pattern by a distance, and wherein the distance is covered by a portion of the second electrode.

14 Claims, 7 Drawing Sheets

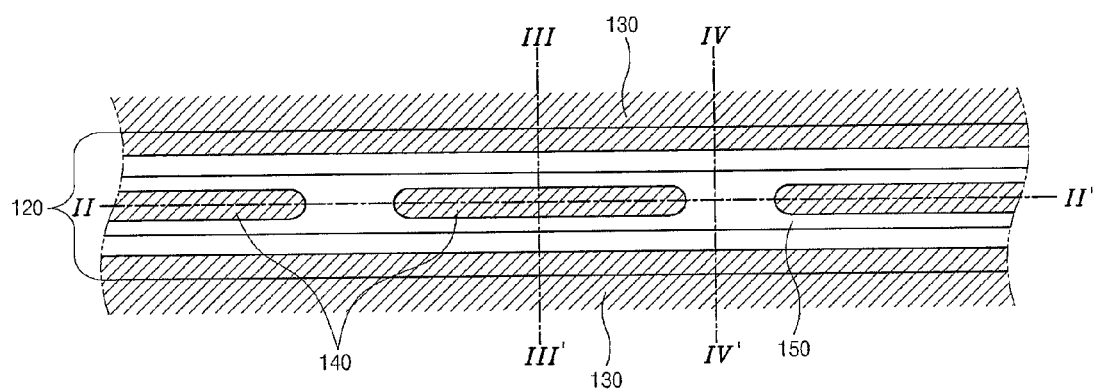
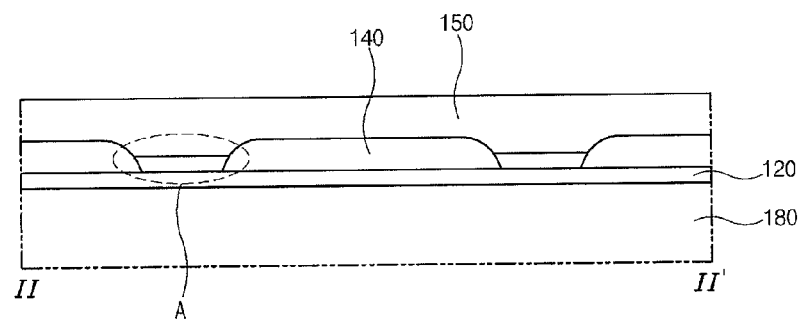

ORGANIC LIGHT EMITTING DIODE DISPLAY DEVICE AND METHOD OF FABRICATING THE SAME

CROSS-REFERENCE TO RELATED APPLICATION

This application claims the benefit of Korean Patent Application No. 10-2013-0160486, filed in Korea on Dec. 20, 2013, which is hereby incorporated by reference.

BACKGROUND OF THE INVENTION

1. Field of the Invention

Embodiments of the invention relate to an organic light emitting diode (OLED) display device, and more particularly, to a top emission type OLED display device having an improved display quality.

2. Discussion of the Related Art

FIG. 1 shows the related art OLED display device.

The OLED display device as a flat panel display device is a self-emission type display device. The OLED display device includes a first electrode 10, a second electrode 70 and an organic layer 60 therebetween. Voltages are applied to the first and second electrodes 10 and 70, a current is supplied to the organic layer 60 such that an emitting layer of the organic layer 60 emits light. The emission from the organic layer 60 can be controlled by controlling the voltages or the current.

The OLED display device may be classified into a passive matrix type and an active matrix type according to a driving method. In addition, the OLED display device may be classified into a top emission type and a bottom emission type according to an image displaying surface. In the top emission type OLED display device, the image is displayed on a front surface of a substrate. In the bottom emission type OLED display device, the image is displayed on a bottom surface of the substrate.

In the active matrix type OLED display device, a switching element 1 is positioned in each pixel such that each pixel is controlled by the switching element 1. The switching element 1 may include a thin film transistor and a capacitor and receive a signal and a power to control the organic emitting diode. The switching element 1 controls the voltage or the current, which is supplied to the organic emitting diode, and the first electrode 10 of the organic emitting diode is connected to the switching element 1 to receive the voltage or the current.

The switching element 1 is covered with a passivation layer 80, which includes an organic material or an inorganic material, and the first electrode 10 is electrically connected to the switching element 1 through a contact hole in the passivation layer 80. The first electrode 10 is formed in each pixel, and the first electrodes 10 in adjacent pixels are separated by a pixel definition layer 30. A portion of the first electrode 10, which is not covered with the pixel definition layer 30, is defined as an emitting region.

The active matrix type OLED display device requires an area for the switching element 1. However, since the top emission type OLED display device displays images on a front surface, the area for the switching element 1 is also used as a display area by disposing the organic emitting diode over the switching element 1. The first electrode 10 is disposed over the switching element 1 to overlap the switching element 1, and the organic layer 60 including the emitting layer and the second electrode 70 is formed on the first electrode 10. Since the light from the emitting layer passes through the second electrode 70 in the top emission type OLED display device, the second electrode 70 is formed of a transparent conductive material such as indium-tin-oxide (ITO) or indium-zinc-oxide (IZO).

The second electrode 70 of the OLED display device is connected to a ground voltage or a reference voltage of a constant voltage. A reference power is connected to the second electrode 70 through a pad at a peripheral region of the substrate, and the reference power is supplied to each pixel through the second electrode 70. In the related art OLED display device, the current in each pixel is discharged into an outer reference voltage through the second electrode 70.

SUMMARY OF THE INVENTION

Accordingly, the embodiments of the invention are directed to an OLED display device and a method of fabricating the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, the embodiments of the invention provide an organic light emitting diode display device includes a plurality of first electrodes connected to a plurality of switching elements, the plurality of first electrodes extending in a first direction and a second direction that are non-parallel; a common line extending in the first direction and dividing adjacent plurality of first electrodes in the second direction; a pixel definition layer disposed at boundaries of the plurality of first electrodes; an adhesive pattern disposed on the common line and extending in the first direction; a wall on the adhesive pattern and overlapping the common line; an organic layer on the plurality of first electrodes and on the wall; and a second electrode on the organic layer and contacting the common line in a portion under an overhang of the wall, wherein the organic layer is spaced apart from the adhesive pattern by a distance in the second direction, and wherein the distance is covered by a portion of the second electrode.

In another aspect of the invention, the embodiments of the invention provide a method of fabricating an organic light emitting diode display device includes forming a plurality of first electrodes connected to a plurality of switching elements, the plurality of first electrodes extending in a first direction and a second direction; forming a common line to extend in the first direction and to divide adjacent plurality of first electrodes in the second direction; forming a pixel definition layer at boundaries of the plurality of first electrodes; forming an adhesive pattern on the common line to extend in the first direction; forming a wall in the first direction to contact a top surface of the adhesive pattern, wherein a side surface of the wall protrudes beyond the adhesive pattern; forming an organic layer on the plurality of first electrodes; and forming a second electrode on the organic layer and under an overhang of the wall, wherein a portion of the common line is exposed under the wall, and the second electrode contacts the common line under the wall, wherein the organic layer is spaced apart from the adhesive pattern by a distance in the second direction, and wherein the distance is covered by a portion of the second electrode.

In another aspect of the invention, the embodiments of the invention provide an organic light emitting diode display device including a plurality of first electrodes connected to a plurality of switching elements, the plurality of first electrodes extending in a first direction and a second direction that are non-parallel; a common line extending in the first direction and dividing adjacent plurality of first electrodes in the second direction; a pixel definition layer disposed at boundaries of the plurality of first electrodes; an adhesive pattern disposed on the common line and extending in the first direction; a wall on the adhesive pattern and overlapping the common line; an organic layer on the plurality of first electrodes and on the wall; at least one cavity disposed between the wall and the common line at a location of the common line where the adhesive pattern is absent; and a second electrode on the organic layer and contacting at least a portion of the common line that is within the at least one cavity.

It is to be understood that both the foregoing general description and the following detailed description are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 5A to 5D are plane views showing fabricating processes of an OLED display device according to a second embodiment of the invention.

FIG. 6 is a cross-sectional view taken along the line II-II' in FIG. 5D.

DETAILED DESCRIPTION OF THE EMBODIMENTS

Reference will now be made in detail to embodiments of the invention, examples of which are illustrated in the accompanying drawings.

In the related art OLED display device, each pixel is connected to the reference power through the second electrode. In the top emission type OLED display device, since the second electrode is formed of a transparent conductive material such as ITO and IZO, the resistance of the second electrode is relatively high. As a result, a voltage drop may occur. Particularly, as a distance between the pixel and the pad is larger, the voltage drop is increased.

When the potential of the second electrode is different than a reference power, the applied voltage to the organic emitting diode is deviated from the desired voltage such that the OLED display device emits undesired lights. Since the potential of the second electrode is varied according to a position of the pixel, the display quality of the OLED display device is degraded.

An OLED display device, which can prevent the above problems, is explained.

Figure 1:
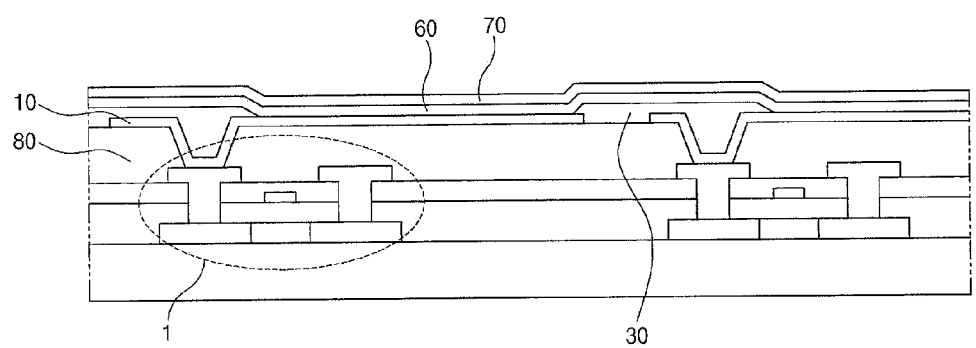
FIG. 1 shows the related art OLED display device.
Figure 2:
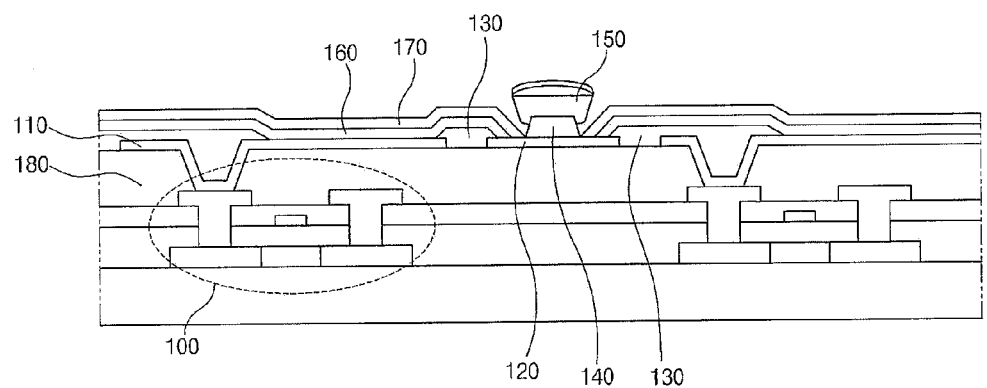
FIG. 2 is a cross-sectional view of an OLED display device according to a first embodiment of the invention.
Figure 3:
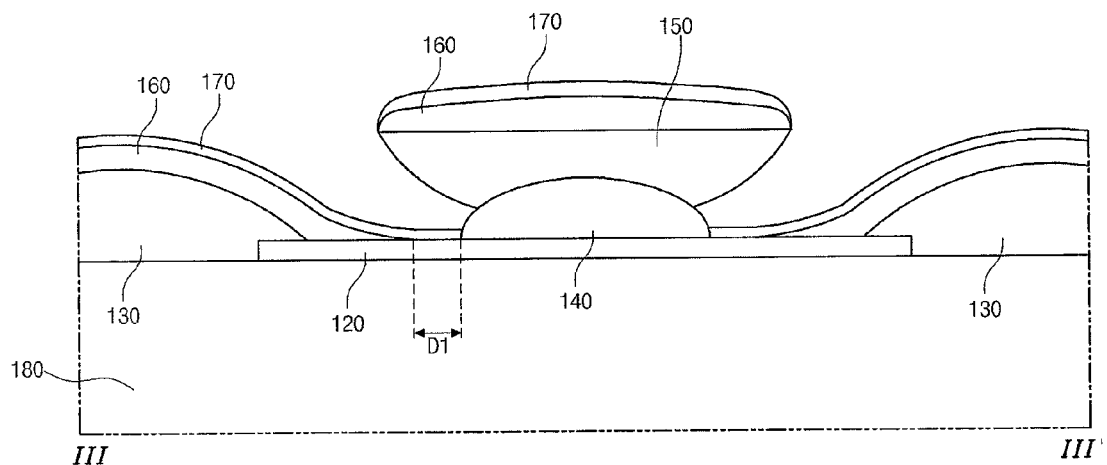
FIG. 3 is an enlarged view of a portion of an OLED display device in FIG. 2.

FIG. 2 is a cross-sectional view of an OLED display device according to a first embodiment of the invention, and FIG. 3 is an enlarged view of a portion of an OLED display device in FIG. 2. FIG. 3 shows a cross-sectional view taken along line III-III' in FIG. 5D.

As shown in FIG. 2, the OLED display device according to the first embodiment of the invention includes a substrate 50, a switching element 100, a first electrode 110, a common line 120, a pixel definition layer 130, an adhesive pattern 140, a wall 150, an organic layer 160, a second electrode 170, and a passivation layer 180.

The switching element 100 is formed in each pixel and controls the emission of each pixel. FIG. 2 shows a thin film transistor (TFT) as the switching element 100. Alternatively, the switching element 100 may further include a capacitor. In addition, at least two TFTs and capacitors may be formed in each pixel.

The TFT in FIG. 2 has a co-planar structure. Alternatively, the TFT may have a reverse-staggered structure, a back-channel etch structure, an etch-stopper structure, a top gate structure or a bottom gate structure. There is no limitation to the structure or the shape of the TFT. In addition, a semiconductor layer of the TFT includes poly-crystalline silicon, amorphous silicon, oxide semiconductor or organic semiconductor.

The passivation layer 180 is formed on the switching element 100. The passivation layer 180 includes an inorganic insulating layer of silicon nitride (SiNx), silicon oxide (SiOx) or silicon oxynitride (SiON) or an organic insulating layer of photo-acryl. The passivation layer includes a contact hole exposing an electrode of the switching element 100. The exposed electrode of the switching element 100 may be a source electrode or a drain electrode of the TFT or an electrode of the capacitor.

The first electrode 110 is formed in each pixel. The first electrode 110 is connected to the switching element 100 through the contact hole in the passivation layer 180 to receive the voltage or the current. An organic emitting diode includes the first electrode 110, the second electrode 170 and the organic layer 160 therebetween. The current is supplied to the organic layer 160 by the voltages applied to the first and second electrodes 110 and 170 such that the light is emitted from an emitting layer of the organic layer 160.

To emit the light over the substrate 50, the first electrode 110 is formed of a metallic material having a high reflection ratio and a low resistance. For example, the first electrode 110 may be formed of copper (Cu), Cu alloy, aluminum (Al), Al alloy, silver (Ag) or Ag alloy. When the first electrode 110 serves as anode, the first electrode 110 includes an ITO layer or an IZO layer to increase a work function. Since the light from the organic layer 160 is reflected on the first electrode 110 towards the second electrode 170, the first electrode 110 is positioned over the switching element 100 and in each pixel.

The common line 120 is formed on the same layer as the first electrode 110. To minimize the voltage drop in the second electrode 170, the common line 120 is formed of a low resistance metallic material. The common line 120 may be formed of the same material as the first electrode 110. The common line 120 is disposed between adjacent first electrodes 110 which are arranged in a matrix shape by extending in a first direction and a second direction. The common line 120 extends along a vertical direction and a horizontal direction. To minimize the voltage drop, the common line 120 may be disposed in each pixel line. Alternatively, one common line 120 may be disposed in several pixel lines. The common line 120 is connected to a ground voltage or a reference power of a constant voltage through a pad at a peripheral region of the substrate.

A pixel definition layer 130 is formed on the first electrode 110 and the common line 120. The pixel definition layer 130 is formed along edges of the first electrode 110 such that the pixel is surrounded by the pixel definition layer 130. A portion, e.g., a center portion, of the first electrode 110 is not covered with the pixel definition layer 130. The portion is defined as an emitting area. In addition, the pixel definition layer 130 exposes a center of the common line 120. In embodiments of the invention, the pixel definition layer 130 covers peripheral portions of both the common line 120 and the first electrode 110 that are adjacently placed.

The adhesive pattern 140 is formed on the common line 120. The adhesive pattern 140 is spaced apart from the pixel definition layer 130 such that portions of the common line 120 are exposed through a space between the adhesive pattern 140 and the pixel definition layer 130. The adhesive pattern 140 is formed on the same layer as the pixel definition layer 130. The adhesive pattern 140 may be formed of an organic material, e.g., photo-acryl, or the same material as the pixel definition layer 130. The adhesive pattern 140 may be simultaneously formed with the pixel definition layer 130 without an additional mask process. In this instance, the adhesive pattern 140 may extend from the pixel definition layer 130. A material of the adhesive pattern 140 has a positive photosensitive property such that the adhesive pattern 140 has a taper shape. Namely, a lower portion of the adhesive pattern 140 has a width larger than an upper portion thereof. The adhesive pattern 140 extends along a length direction of the common line 120.

The wall 150 is formed on the adhesive pattern 140 and extends along a length direction of the adhesive pattern 140. An adhesive strength between the wall 150 and the common line 120 is increase by the adhesive pattern 140 such that the separation of the wall 150 from the common line 120 is prevented. The wall 150 is formed of an organic material having a negative photosensitive property. For example, the wall 150 may be formed of photo-acryl. By controlling the exposing amount in the exposing step and a condition of the baking step in a process of forming the wall 150, a shape of the wall 150 is controlled.

To separate the organic layer 160 in each pixel, at least one side surface of the wall 150 has a reverse-tapered shape. Both side surfaces of the wall 150 may have the reverse-tapered shape. Each side surface of the wall 150 protrudes beyond the adhesive pattern 140. Namely, the wall 150 has a width larger than the adhesive pattern 140. The reverse-tapered shaped side surface of the wall 150 is not covered with the adhesive pattern 140 and the pixel definition layer 130 and is disposed over the exposed portion of the common line 120.

The wall 150 may be formed to be adjacent to the common line 120. To provide a space, where the second electrode 170 contacts the common line 120, the wall 150 is positioned on an upper surface of the adhesive pattern 140 and spaced apart from the common line 120 by a pre-determined distance.

The organic layer 160 is formed on the first electrode 110 and the wall 150. The organic layer 160 may include an emitting layer, which includes an emitting material, and a common layer. The common layer includes a hole injection layer, a hole transporting layer, an electron transporting layer and an electron injection layer. The common layer is formed through all pixels. The emitting layer is formed in each pixel to produce different color lights in each pixel. Alternatively, the emitting layer may be formed through all pixels to produce the same color light in all the pixels. The organic layer 160 in the emitting area of the first electrode 110 constitutes the organic emitting diode with the first and second electrodes 110 and 170.

Referring to FIG. 3, the organic layer 160 is formed on the pixel definition layer 130 and the wall 150. Since a portion of the common line 120 is shielded by the wall 150 and/or the adhesive pattern 140, the organic layer 160 is not formed on a portion of the common line 120 that is under the wall 150 (or under an overhand of the wall 150). For example, since the organic layer 160 is formed of an organic material by a vacuum deposition process, the organic material is isotropically deposited. Accordingly, the organic layer 160 is spaced apart from the adhesive pattern 140 by a pre-determined distance "D1" such that the portion of the common line 120 that is under the wall 150 is exposed through a space between the organic layer 160 and the adhesive pattern 140. Namely, since the wall 150 has the reverse-tapered shape, the organic layer 160 is discontinuous in a boundary between the pixel definition layer 130 and the wall 150.

The second electrode 170 is formed on the organic layer 160. The second electrode 170 over the emitting area of the first electrode 110 constitutes the organic emitting diode with the first electrode 110 and the organic layer 160. Because the light from the organic layer 160 should be transmitted through the second electrode 170, the second electrode 170 is formed of a transparent conductive material such as ITO or IZO. To improve the transmittance of the second electrode 170, it is preferred but not required to reduce a thickness of the second electrode 170. However, the resistance of the second electrode 170 is inversely proportional to the thickness of the second electrode 170. In the embodiment of the invention, the second electrode 170 has a thickness of about 10 to 20 nm. When the second electrode 170 serves as a cathode, the second electrode 170 includes a magnesium-silver alloy (MgAg) layer to decrease the work function.

For example, since the second electrode 170 is formed of the transparent conductive material, e.g., ITO or IZO, by a sputtering process, the transparent conductive material is anisotropically deposited. Accordingly, the second electrode 170 covers an end of the organic layer 160 and extends into the adhesive pattern 140. Namely, an end of the second electrode 170 is disposed under the wall 150. As a result, the second electrode 170 contacts the common line 120 through a space between the adhesive pattern 140 and the organic layer 160. A contact area between the second electrode 170 and the common line 120 is proportional to the pre-determined distance "D1" between the adhesive pattern 140 and the organic layer 160. The second electrode 170 receives the reference power through the common line 120 and provides the reference power into the organic emitting diode in each pixel. Since the reference power is provided through the common line 120, which is formed of the low resistance metallic material, the voltage drop is reduced even if the second electrode 170 includes a relatively high resistance thin film.

The first electrode 110 serves as an anode, and the second electrode 170 serves as a cathode. Alternatively, the first electrode 110 may serve as a cathode, and the second electrode 170 may serve as an anode.

Figure 7:
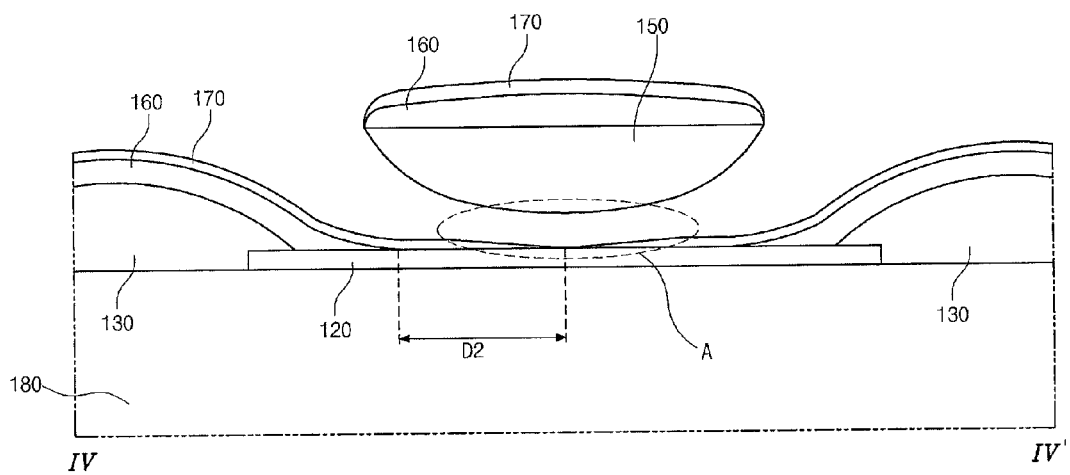
FIG. 7 is a cross-sectional view taken along the line IV-IV' in FIG. 5D.

FIGS. 6 and 7 are cross-sectional views of portions of an OLED display device according to a second embodiment of the invention. FIG. 6 is a cross-sectional view taken along the line II-II' in FIG. 5D, and FIG. 7 is a cross-sectional view taken along the line IV-IV' in FIG. 5D.

An OLED display device according to the second embodiment has substantially the same structure as the OLED display device according to the first embodiment except the adhesive pattern 140. The explanation is focused on the adhesive pattern 140.

FIG. 6 shows the cross-sectional view taken along a length direction of the common line 120. FIG. 6 does not show the organic layer 160 (of FIG. 3) and the second electrode 170 (of FIG. 3).

A plurality of adhesive patterns 140 are formed on the common line 120 along the length direction of the common line 120. The plurality of adhesive patterns 140 are spaced apart from each other by a gap (or a pre-determined gap or a distance) along the length direction of the common line 120. On the plurality of adhesive patterns 140, the wall 150 is formed. Since the plurality of adhesive patterns 140 are spaced apart from each other by the gap, there is a cavity "A" under the wall 150 and between adjacent adhesive patterns 140. The common line 120 is exposed in the cavity "A". Since the adhesive patterns 140 should have sufficient adhesion with the wall and support the wall 150, a length of each adhesive pattern 140 is preferred but not required to be greater than the gap between adjacent adhesive patterns 140. For example, the gap between adjacent adhesive patterns 140 may be about 5 to 50 micrometers. In other embodiments of the invention, some or all of the cavity "A" need not be formed so that there is direct contact between the wall 150 and the common line 120 or between the wall 150 and the second electrode 170.

FIG. 7 shows the cross-sectional view taken along a width direction of the common line 120 and the gap between adjacent adhesive patterns 140.

The organic layer 160 is formed on the pixel definition layer 130 and the wall 150, and the second electrode 170 is formed on the organic layer 160 and over the wall 150. The second electrode 170 extends along the cavity "A" under the wall 150 by a pre-determined distance "D2" and contacts the common line 120 under the wall 150. Since the second electrode 170 extends along the cavity "A" and contacts the common line 120 under the wall 150, a contact area between the second electrode 170 and the common line 120 is increased. The second electrode 170 may covers an entire surface of the cavity "A" to maximize the contact area between the second electrode 170 and the common line 120. Since the contact area between the second electrode 170 and the common line 120 in the OLED display device according the second embodiment becomes larger than that in the OLED display device according to the first embodiment, the contact resistance between the second electrode 170 and the common line 120 and the voltage loss or drop are further decreased. In addition, even though the organic layer 160 further extends into a portion under the wall 150, the contact between the second electrode 170 and the common line 120 is secured. Also, in embodiments of the invention, a portion of the second electrode 170 is separated from the wall 150 by a distance in a third direction that is non-parallel to the first and second directions. In FIG. 7, the third direction may be a vertical direction.

Accordingly, the image quality degradation resulting from the voltage drop in the second electrode is prevented, and the display quality is improved.

FIGS. 4A to 4E are cross-sectional views showing fabricating processes of an OLED display device according to a first embodiment of the invention, and FIGS. 5A to 5D are plane views showing fabricating processes of an OLED display device according to a second embodiment of the invention. As mentioned above, since the OLED display device according to the second embodiment has substantially the same structure as the OLED display device according to the first embodiment except the adhesive pattern 140, the fabrication processes for the OLED display devices according to the first and second embodiments are explained together.

Figure 4A:
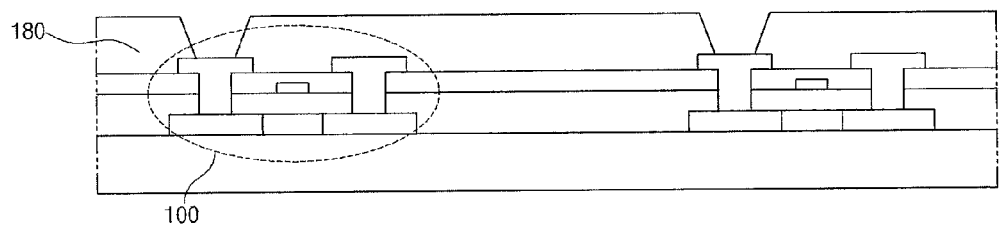
FIG. 4A to 4E are cross-sectional views showing fabricating processes of an OLED display device according to a first embodiment of the invention.

FIG. 4A shows a cross-sectional view after forming the passivation layer 180. The switching element 100 is formed on the substrate, and the passivation layer 180 including a contact hole exposing an electrode of the switching element 100 is formed on the switching element 100.

Figure 4B:
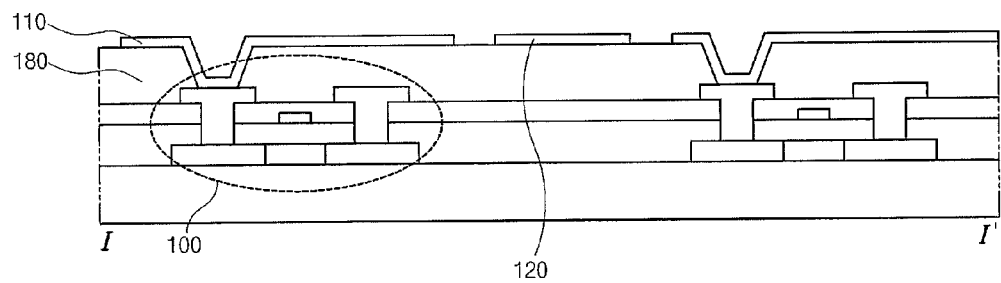
Figure 5A:
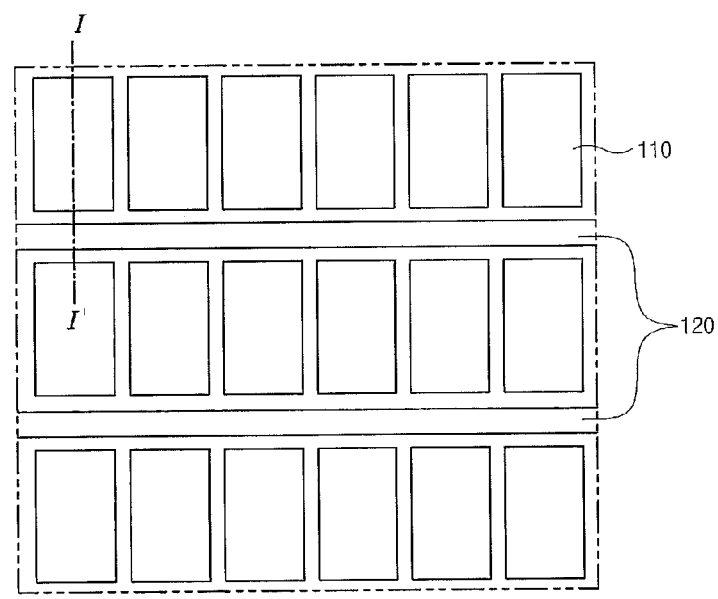

Next, as shown in FIG. 4B, the first electrode 110 and the common line 120 are formed on the passivation layer 180. The first electrode 110 is connected to the switching element 100 through the contact hole of the passivation layer 180 and is positioned in each pixel with a matrix shape. As shown in FIG. 5A, the common line 120 is horizontally or vertically disposed between the first electrodes 110. One common line 120 is formed in each pixel line. Alternatively, one common line 120 may be formed per several pixel lines. FIG. 4B shows a cross-sectional view taken along the line I-I' in FIG. 5A.

Figure 5B:
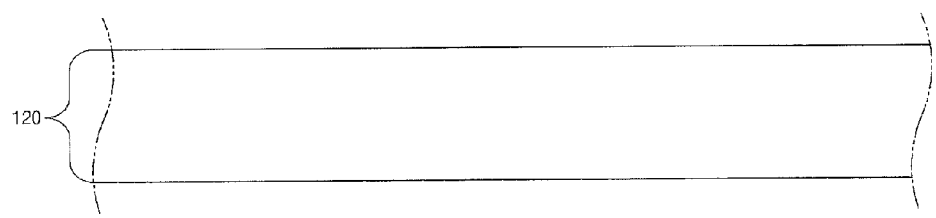

FIG. 5B is a plane view of the common line 120. The common line 120 extends along a direction, i.e., a horizontal direction or a vertical direction.

Figure 4C:
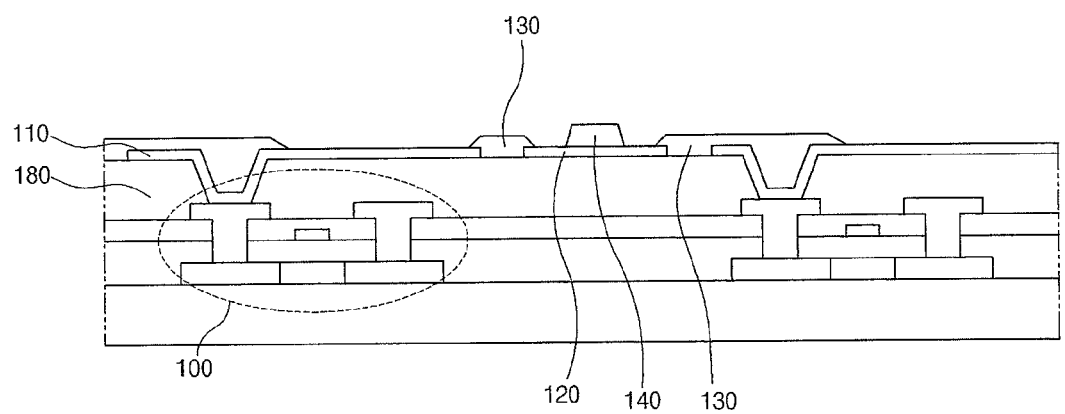
Figure 5C:
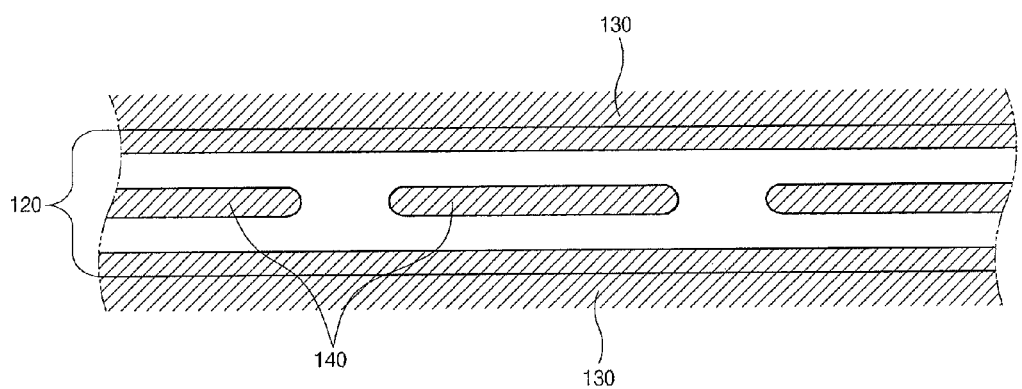

Next, as shown in FIG. 4C, the pixel definition layer 130 is formed along edges of the first electrode 110 to define the emitting area. In addition, the adhesive pattern 140 is formed on the common line 120 and along a length direction of the common line 120. A positive photosensitive type photoresist material is coated, exposed using a mask, baked and developed to form the pixel definition layer 130 and the adhesive pattern 140. By simultaneously forming the pixel definition layer 130 and the adhesive pattern 140, the number of the mask processes for fabricating the OLED display device is reduced. At least one side of the adhesive pattern 140 is spaced apart from the pixel definition layer 130 to expose a portion of the common line 120. One side of the adhesive pattern 140 may extend from the pixel definition layer 130. It is preferred but not required that both sides of the adhesive pattern 140 are spaced apart from the pixel definition layer 130. As shown in FIG. 5C, the adhesive patterns 140 are spaced apart from each other by a gap (or a pre-determined gap or a distance). In an embodiment of the invention, the gap may be formed by forming the adhesive pattern 140 at certain intervals so that the gap is formed where the adhesive pattern 140 is absent. Alternatively, the adhesive pattern 140 extends along the common line 120 with one-body as illustrated in the OLED display device according to the first embodiment.

Figure 4D:
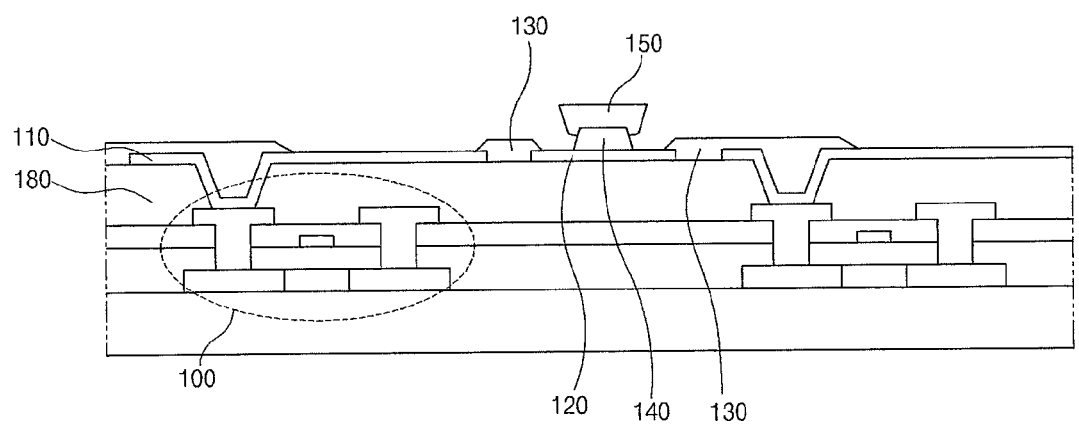

As shown in FIG. 4D, the wall 150 is formed on the adhesive pattern 140. A negative photosensitive type organic insulating material, such as photo-acryl or polyimide, is coated, exposed using a mask, baked and developed to form the wall 150. In the negative photosensitive type material, the exposed portion remains after the developing process. As a result, in the wall 150, an upper portion has a larger width than a lower portion thereof. Namely, the wall 150 has a reverse-tapered shape. As the exposing amount, the baking temperature and the baking time are larger, the cured portion is increased and remains as the wall 150. By controlling the exposing amount, the baking temperature and the baking time, the shape of the wall 150 can be controlled. When the angle of the reverse-tapered shape is larger, the formation of the organic layer 160 (of FIG. 4E) under the wall 150 is sufficiently prevented. In addition, when the wall 150 is spaced apart from the common line 120 in a cross-section, a contact area between the second electrode 170 (of FIG. 3) and the common line 120 is increased. The exposing amount and the condition of the baking process are controlled so that a portion of the organic insulating material for the wall 150 adjacent to the common line 120 is not cured. As a result, the portion of the organic insulating material is removed in the developing process to expose the common line 120. Namely, the wall 150 contacts a top surface of the adhesive pattern 140 and does not contact the common line 120 in an embodiment of the invention.

As shown in FIG. 5D, when the adhesive patterns 140 are formed to be spaced apart from each other, the wall 150 is formed to cover all adhesive patterns 140 such that a cavity "A" (of FIG. 6) is formed between the wall 150 and the common line 120 and in adjacent adhesive patterns 140.

Figure 4E:
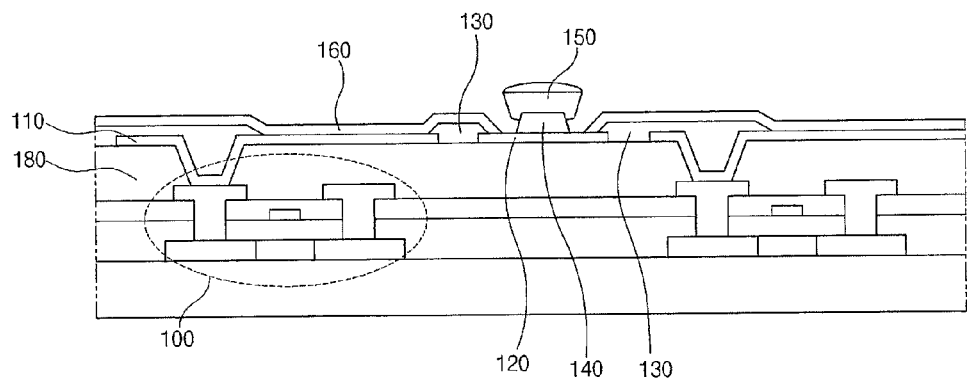

As shown in FIG. 4E, the organic layer 160 is formed over the substrate including the wall 150. The organic layer 160 includes an emitting layer and a common layer. The organic layer 160 may be formed in each pixel or through all pixels. The organic layer 160 may be formed by a vacuum deposition method. For example, the organic layer 160 may be formed by a thermal vacuum deposition method. In the vacuum deposition method, the material is evaporated in a vacuum condition, and the evaporated material is deposited on the substrate. The material may be positioned under the substrate. The vacuum deposition process is performed in an in-line type or a batch type.

Since the evaporated material in the vacuum condition has a strong linearity, the evaporated material is formed along a direction. Namely, the evaporated material is isotropically deposited. Accordingly, the organic layer 160 is not formed under the wall 150 such that a portion of the common line 120 is exposed through a spaced arrangement of the organic layer 160 and the adhesive pattern 140.

An end of the organic layer 160 may extend into a portion under the wall 150. A length of the organic layer 160 under the wall 150 may be increased depending on a fabricating method or a fabricating condition for the organic layer 160. In this instance, by controlling shapes of the wall 150 and the adhesive pattern 140, an exposing area of the common line 120 is secured. When the adhesive patterns 140 are formed to be spaced apart from each other, the common line 120 is exposed through a space between adjacent adhesive patterns 140.

The organic layer 160 may be formed by other methods. The method having a strong linearity and a low step coverage is preferred but not required to form the organic layer 160.

As shown in FIG. 2, the second electrode 170 is formed on the organic layer 160 to fabricate the OLED display device. The second electrode 170 is formed of a transparent conductive material by a sputtering method, for example. The sputtering method has a lower linearity than the vacuum deposition method. Namely, the material is anisotropically deposited in the sputtering method. As a result, the second electrode 170 is formed under the wall 150 to contact the exposed portion of the common line 120. The second electrode 170 may be formed on a side surface of the wall 150. When the adhesive patterns 140 are formed to be spaced apart from each other, the second electrode 170 extends into a space (or the gap) between adjacent adhesive patterns 140 such that a contact area between the second electrode 170 and the common line 120 is increased.

The second electrode 170 may be formed by other methods, e.g., a chemical vapor deposition method. The method having a step coverage higher than the method for the organic layer 160 is preferred but not required to form the second electrode 170.

In the OLED display device fabricated by the above process, an adhesive strength of the wall 150 is increased such that separation of the wall 150 is prevented. In addition, by decreasing a contact resistance between the second electrode 170 and the common line 120 and increasing a contact area between the second electrode 170 and the common line 120, the image quality of the OLED display device can be improved.

It will be apparent to those skilled in the art that various modifications and variations can be made in the embodiments of the invention without departing from the spirit or scope of the invention. Thus, it is intended that the embodiments of the invention cover the modifications and variations of this invention provided they come within the scope of the appended claims and their equivalents.

What is claimed is:

1. An organic light emitting diode display device, comprising:
   a plurality of first electrodes connected to a plurality of switching elements, the plurality of first electrodes extending in a first direction and a second direction that are non-parallel;
   a common line extending in the first direction and dividing adjacent plurality of first electrodes in the second direction;
   a pixel definition layer disposed at boundaries of the plurality of first electrodes;
   an adhesive pattern disposed on the common line and extending in the first direction;
   a wall on the adhesive pattern and overlapping the common line;
   an organic layer on the plurality of first electrodes and on the wall; and
   a second electrode on the organic layer and contacting the common line in a portion under an overhang of the wall,
   wherein the organic layer is spaced apart from the adhesive pattern by a distance in the second direction, and
   wherein the distance is covered by a portion of the second electrode.

2. The organic light emitting diode display device of claim 1, wherein the adhesive pattern is formed on portions of the common line in the first direction.

3. The organic light emitting diode display device of claim 1, wherein the portion of the second electrode is separated from the wall by another distance in a third direction that is non-parallel to the first and second directions.

4. The organic light emitting diode display device of claim 1, further comprising at least one cavity disposed between the wall and the common electrode at locations where the adhesive pattern is absent.

5. The organic light emitting diode display device of claim 4, wherein the portion of the second electrode is disposed in the at least one cavity.

6. A method of fabricating an organic light emitting diode display device, the method comprising:
   forming a plurality of first electrodes connected to a plurality of switching elements, the plurality of first electrodes extending in a first direction and a second direction;
   forming a common line to extend in the first direction and to divide adjacent plurality of first electrodes in the second direction;
   forming a pixel definition layer at boundaries of the plurality of first electrodes;
   forming an adhesive pattern on the common line to extend in the first direction;
   forming a wall in the first direction to contact a top surface of the adhesive pattern, wherein a side surface of the wall protrudes beyond the adhesive pattern;
   forming an organic layer on the plurality of first electrodes; and forming a second electrode on the organic layer and under an overhang of the wall, wherein the organic layer is spaced apart from the adhesive pattern by a distance in the second direction, and wherein the distance is covered by a portion of the second electrode.

7. The method of claim 6, wherein the adhesive pattern is formed on portions of the common line in the first direction.

8. The method of claim 6, wherein the portion of the second electrode is separated from the wall by another distance in a third direction that is non-parallel to the first and second directions.

9. The method of claim 6, wherein at least one cavity is disposed between the wall and the common electrode at locations where the adhesive pattern is absent.

10. The method of claim 9, wherein the portion of the second electrode is disposed in the at least one cavity.

11. An organic light emitting diode display device, comprising:

a plurality of first electrodes connected to a plurality of switching elements, the plurality of first electrodes extending in a first direction and a second direction that are non-parallel;

a common line extending in the first direction and dividing adjacent plurality of first electrodes in the second direction;

a pixel definition layer disposed at boundaries of the plurality of first electrodes;

an adhesive pattern disposed on the common line and extending in the first direction;

a wall on the adhesive pattern and overlapping the common line;

an organic layer on the plurality of first electrodes and on the wall;

at least one cavity disposed between the wall and the common line at a location of the common line where the adhesive pattern is absent; and a second electrode on the organic layer and contacting at least a portion of the common line that is within the at least one cavity.

12. The organic light emitting diode display device of claim 11, wherein the adhesive pattern is formed on portions of the common line in the first direction.

13. The organic light emitting diode display device of claim 11, wherein the portion of the second electrode is separated from the wall by another distance in a third direction that is non-parallel to the first and second directions.

14. The organic light emitting diode display device of claim 11, wherein the portion of the second electrode is disposed in the at least one cavity.

* * * * *